United States Patent [19]

Houston

[11] Patent Number: 5,406,144
[45] Date of Patent: Apr. 11, 1995

[54] POWER REDUCTION IN A TEMPERATURE COMPENSATING TRANSISTOR CIRCUIT

[75] Inventor: Theodore W. Houston, Richardson, Tex.

[73] Assignee: Texas Instruments Incorporated, Dallas, Tex.

[21] Appl. No.: 84,680

[22] Filed: Sep. 7, 1993

[51] Int. Cl.⁶ .................. H03K 3/01; H03K 19/003; H03F 1/30
[52] U.S. Cl. .................................. 327/513; 327/538; 327/543
[58] Field of Search ............ 307/491, 497, 591, 296.6, 307/310; 330/271, 279, 280, 281

[56] References Cited

U.S. PATENT DOCUMENTS

| | | | |
|---|---|---|---|
| 5,136,182 | 8/1992 | Fawal | 307/491 |
| 5,149,994 | 9/1992 | Neu | 307/491 |
| 5,157,287 | 10/1992 | Sakagami | 307/491 |
| 5,187,395 | 2/1993 | Pirez | 307/491 |
| 5,241,286 | 8/1993 | Mirow | 331/108 B |
| 5,303,191 | 4/1994 | Eagan et al. | 307/591 |

Primary Examiner—William L. Sikes
Assistant Examiner—Fetsum Abraham
Attorney, Agent, or Firm—Jacqueline J. Garner; Richard L. Donaldson; William E. Hiller

[57] ABSTRACT

A circuit for providing parameter compensation to a drive transistor of logic circuit A. A compensating transistor circuit B is connected in parallel with the drive transistor in order to compensate the parameter dependence of the current in the drive transistor. Bias circuitry C is also provided for supplying a bias voltage $V_b$ to a gate of the compensating transistor circuit B, wherein the voltage is responsive to a predetermined parameter. The bias circuitry C comprises an element which is sensitive to the predetermined parameter.

17 Claims, 2 Drawing Sheets

POWER REDUCTION IN A TEMPERATURE COMPENSATING TRANSISTOR CIRCUIT

CROSS-REFERENCE TO RELATED APPLICATIONS

The following coassigned patent application is hereby incorporated herein by reference:

| Serial No. | Filing Date | TI Case No. |
| --- | --- | --- |
| 08/066,698 | 05/25/93 | TI-17000 |

FIELD OF THE INVENTION

The invention relates generally to semiconductor devices and more specifically to current compensating transistor circuits.

BACKGROUND

The variation of drive current in transistor circuits due to various parameters such as temperature, gate length or threshold voltage sometimes leads to undesirable compromise in circuit performance. U.S. Pat. application No. 837,200, filed Feb. 14, 1992 and assigned to Texas Instruments, INC. addresses the temperature compensation generally needed in a circuit involving transistors. Metal oxide semiconductor ("MOS") circuits and complementary metal oxide semiconductor ("CMOS") circuits have operating characteristics which are strongly dependent upon parameters such as gate length, threshold voltage, or temperature. In particular, the conductance of MOS or of a CMOS field effect transistor ("FET") decreases with increasing temperature. As a result of this variation, circuit performance must sometimes be reduced to keep a circuit functional over a reasonable temperature range. FET performance is generally reduced so that the transistor will not over-conduct in the low temperature domain. This compromise results in a less capable circuit given a particular level of technology. In most instances, a circuit designed to operate over a wide temperature range simply does not switch as fast as a circuit designed to operate over a narrow temperature range.

Over-conductance in FET circuits causes a momentarily high rate of current change per unit time through the FET when the FET turns on. This change, when coupled with the inherent inductance of a circuit, causes an induced electromotive force ("EMF") which opposes the flow of current. This induced EMF will create a noise in the voltage supply and ground plane. This in turn may cause various errors known in the art such as clock cycle failure. A circuit designed not to cause such errors at low temperature may be slower than would otherwise be necessary at high temperature.

It is sometimes desired to introduce a delay in a circuit of a magnitude equal or greater than some given delay, for example to allow for a specified amount of skew in input signals. A circuit with delay designed to meet that requirement at low temperature may be slower than otherwise necessary at high temperature. Therefore, a need has arisen for a circuit for MOS and CMOS applications which is able to compensate for parameter induced conductance variation.

SUMMARY

A circuit for providing parameter compensation to a circuit node is disclosed. A supplementary transistor is connected in parallel with the drive transistor in order to supplement the current in the drive transistor. In one embodiment, the drive transistor is replaced by the supplementary transistor. Control circuitry is also provided for supplying a bias voltage to a gate of the supplementary transistor, wherein the voltage is responsive to a predetermined parameter. The control circuitry comprises an element which is sensitive to the predetermined parameter.

For example, the temperature dependance of the response of a circuit can be compensated by placing a supplementary transistor in parallel with a drive transistor in the circuit such that the supplementary transistor supplies the current that adds to the current supplied by the drive transistor. The temperature compensation is then obtained by compensating the voltage on the gate of said supplementary transistor such that higher current is supplied at high temperature than at low temperature. This voltage regulation can be accomplished by use of elements with temperature sensitive conductivity, such as diodes or polysilicon resistors. The current through these temperature sensitive elements in the control circuitry can be controlled to save power when the circuit is not active.

An advantage of the invention is providing current-varying parameter compensation to a logic circuit.

A further advantage of the invention is providing a compensation circuit requiring reduced power consumption.

These and other advantages will be apparent to those skilled in the art having reference to this specification in conjunction with the drawings.

BRIEF DISCUSSION OF DRAWINGS

DETAILED DESCRIPTION OF THE INVENTION

The invention is described in conjunction with a CMOS circuit having temperature compensation. It will be apparent to those skilled in the art that other circuits such as MOS and BICMOS circuits may also realize the benefits of the invention. It will also be apparent to those skilled in the art that any parameter which can induce current variation, such as gate length or threshold voltage, may instead be compensated for while realizing the benefits of the invention.

Figure 1:
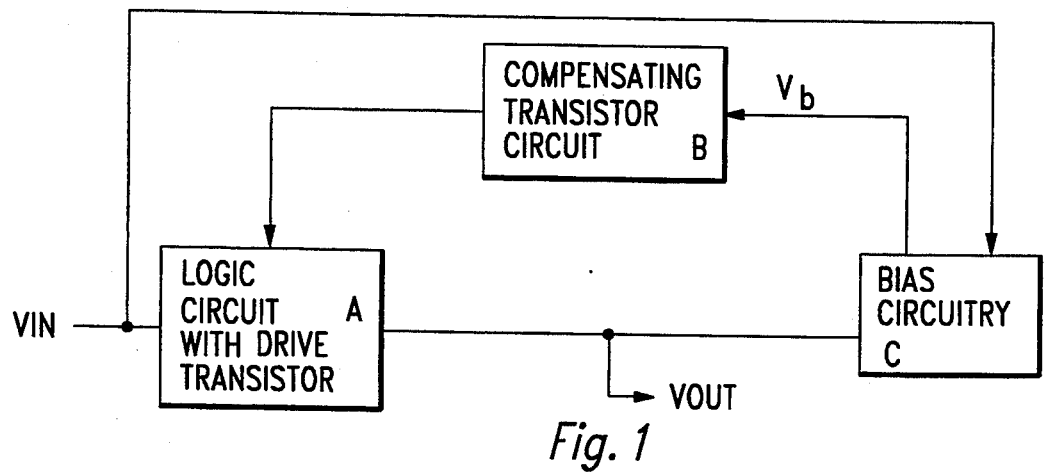
FIG. 1 is a block diagram of a first preferred embodiment of the invention.

FIG. 1 shows a block diagram of the first preferred embodiment of the invention. The circuit is divided into three functional blocks. The first block contains a logic circuit A having a drive transistor for which the parameter compensation is desired. Logic circuit A may comprise, for example an inverter, a nand, or a nor circuit. The preferred embodiments of the invention will be described in conjunction with an inverter. The second block contains the compensating transistor circuit B which compensates the current through the drive transistor of the logic circuit A in order to alter the response time of Vout. The third block contains a bias circuit C which provides the bias voltage Vb to the compensating transistor circuit B. The bias voltage Vb provided by bias circuitry C is dependant upon a predetermined current varying parameter such as temperature, gate length or threshold voltage. The degree to which compensating transistor circuit B compensates the current through the drive transistor in logic circuit A is in turn, determined by the bias voltage, Vb, supplied by bias circuitry C. Three examples of bias circuitry C will be discussed below. However, other alternatives will be apparent to those skilled in the art. The detailed circuitry and operation for these functional blocks are discussed below.

Figure 2A:
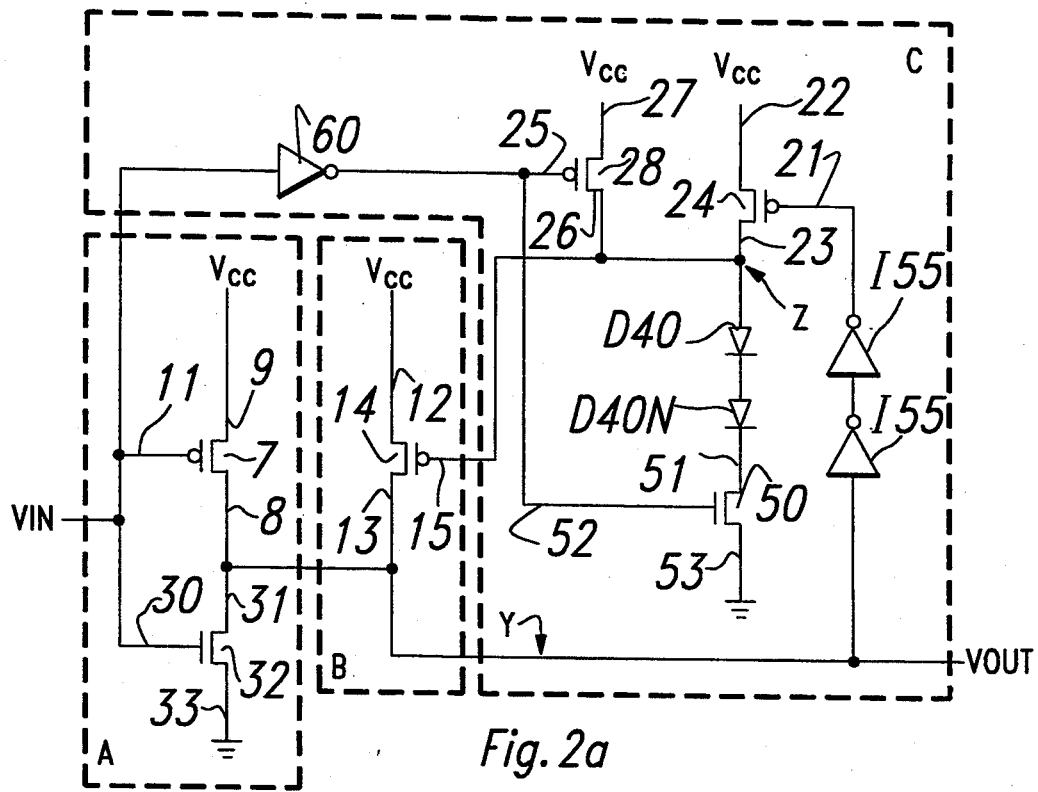
FIG. 2a is a schematic diagram of a first preferred embodiment of the invention applied to compensate the temperature dependence of the rise time of a selected circuit node.

FIG. 2a illustrates a first preferred embodiment for circuitry to provide temperature compensation for the current and voltage rise time on node y. Logic circuit A is shown in FIG. 2a as an inverter having a p-channel transistor 7 and a n-channel transistor 32. As discussed above, other logic circuits may alternatively be used. Compensating circuit B comprises a p- channel transistor 14. Drain 8 of p-channel transistor 7 is connected to the drain 31 of n-channel transistor 32. The gate 11 of p-channel transistor 7 is connected to Vin. The source 9 of p-channel transistor 7 is connected to Vcc. The source 33 of n-channel transistor 32 is connected to ground. The gate 30 of n-channel transistor 32 is connected to Vin. Source 12 of p-channel transistor 14 is connected to Vcc. Gate 15 of p-channel transistor 14 is connected to node z. Drain 13 of p-channel transistor 14 is connected to drain 8 of p-channel transistor 7 and drain 31 of transistor 32. Bias circuity C uses node y as an input to two inverters I50 and I55 connected in series between node y and the gate 21 of p-channel transistor 24. Node y is defined as the intersection of drain 8 of p-channel transistor 7, the drain 31 of n-channel transistor 32, drain 13 of p-channel transistor 14 and the input of inverter I50. The source 22 of p-channel transistor 24 is connected to Vcc and the drain 23 of p-channel transistor 24 is connected to node z. The gate 25 of p-channel transistor 28 is connected to the output of inverter 60. The source 27 of p-channel transistor 28 is connected to Vcc. The drain 26 of p-channel transistor 28 is connected to node z. Node z is defined as the intersection of gate 15 of p-channel transistor 14, drain 23 of p-channel transistor 24, the drain 26 of p-channel transistor 28, and the input to element 40. Circuit element 40 is sensitive to the predetermined current varying parameter (e.g., temperature). FIG. 2a depicts elements 40–40N as a series of diodes between node z and the drain 51 of n-channel transistor 50. Alternately, a polysilicon resistor may be used. Other alternatives include diffusion resistors or transistors. Alternatively, the parameter sensitivity of the voltage on node z can be caused by the parameter sensitivity of n-channel transistor 50 and/or p-channel transistor 24, with element 40 not being sensitive to the parameter. The gate 52 of n-channel transistor 50 is connected to the output of inverter 60. The source 53 of transistor 50 is connected to ground. The input of inverter 60 is connected to Vin. Vout is connected to the input of inverter I50. As an alternative, Vout could be connected directly to the gate 21 of p-channel transistor 24. Other alternatives will be apparent to those skilled in the art. Below, the static conditions are discussed for both Vin high and Vin low. Following that, the dynamic response for a transition of Vin from high to low is discussed.

TABLE I

STATIC CONDITIONS OF TRANSISTORS IN FIG. 2a

| TRANSISTORS | VIN (STATIC) | |
|---|---|---|
| | HIGH | LOW |
| 7 | OFF | ON |
| 14 | OFF | ON |
| 50 | OFF | ON |
| 24 | ON | OFF |
| 28 | ON | OFF |
| 32 | ON | OFF |

Table I shows two conditions: Vin at a static low or a static high. One can see the static conditions for all transistors in the circuit shown in FIG. 2a for both high and low static conditions of Vin. In the high condition at Vin, p-channel transistor 7 will be off due to a high voltage at its gate 11. N-channel transistor 32 will be on due to a high voltage at its gate 30 and thus, node y will be low. P-channel transistor 24 will be on due to a low voltage at its gate 21 and p-channel transistor 28 will be on due to a low voltage at its gate 25. P-channel transistor 14 is off because of its gate 15 being high. N-channel transistor 50 is off because of its gate 52 being low. In the low condition, when Vin is low, p-channel transistor 7 is on because its gate 11 is low and n-channel transistor 32 is off because of its gate being low. P-channel transistor 24 is off because of its gate 21 being high and p-channel transistor 28 is off because of its gate being high. P-channel transistor 14 is on because of its gate 15 being low. N-channel transistor 50 is on because of its gate being high. Thus for either static condition (Vin high or low) there is no static current flow.

Figure 3:
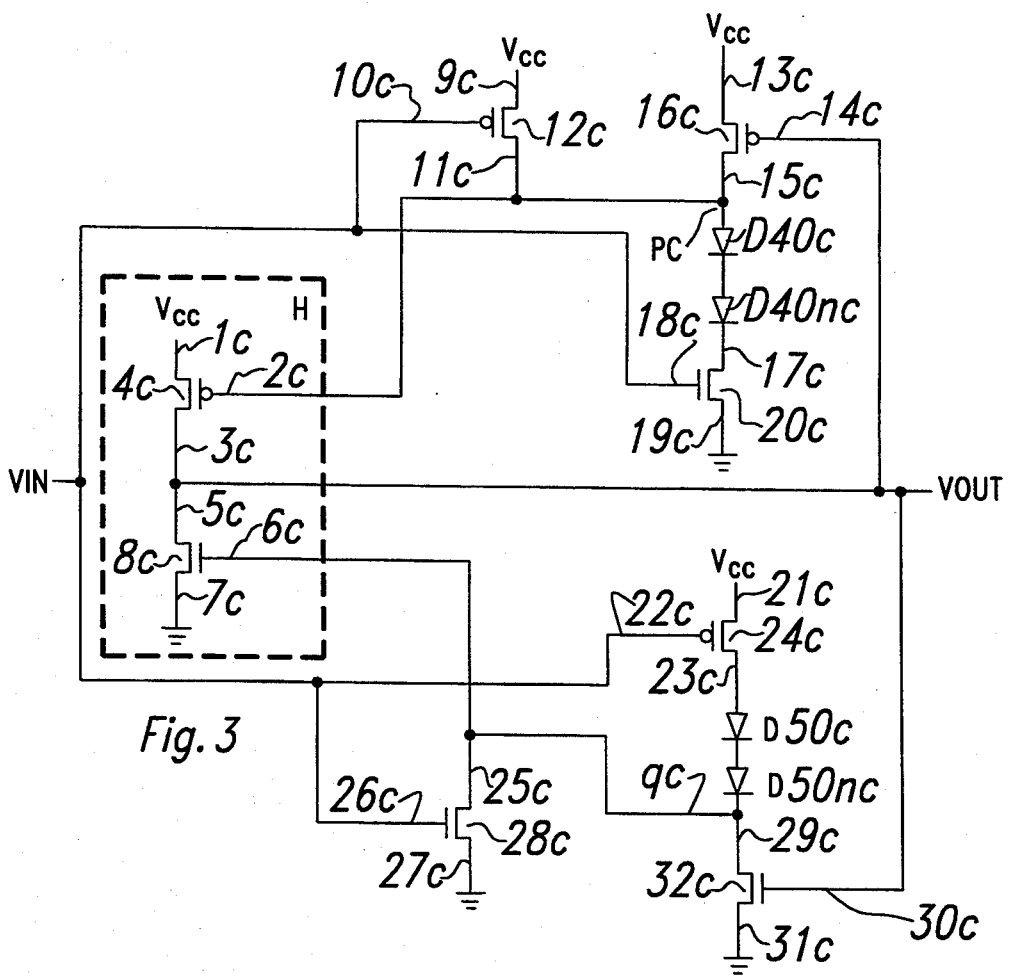
FIG. 3 is a schematic diagram of an alternative first preferred embodiment of the invention.

The embodiment illustrated in FIG. 2a is designed to compensate for the effect of temperature variation of the conductivity of p-channel transistor 7 on the rise time of node y when Vin transitions from high to low. Other parameter variations, such as gate length or threshold voltage may of course also be compensated for. When Vin transitions from high to low, P-channel transistor 7 and n-channel 50 are turned on and n-channel transistor 32 is turned off. P-channel transistor 14 will partially turn on as the voltage on node z falls. Current will flow from Vcc through p-channel transistor 24 through diodes D40–D40N and n-channel transistor 50 to ground, causing the voltage on node z to fall. The voltage to which node z initially falls will depend in part on the conductivity of the diodes, D40 through D40N, which are temperature sensitive. At lower temperatures, the voltage of node z will not fall as low as at higher temperatures. The number of diodes and the relative sizes of the diodes and transistors can be adjusted so that the sum current flowing through p-channel transistor 14 in parallel with p-channel transistor 7 to node y is relatively independent of temperature. It is also possible to select the number of diodes and relative sizes of transistors and diodes such that the flow of current will be greater at high temperature than at low temperature, or vice-versa. Methods for adjusting the relative sizes of the diodes and transistors to achieve the above conditions are well known in the art and will be obvious to those skilled in the art. In one extreme, the p-channel transistor 7 can be eliminated, as illustrated in FIG. 3 and described below. It will also be obvious to those skilled in the state of the art that other temperature insensitivity elements could be used such that the temperature sensitivity of the voltage on node z would be determined by the temperature sensitivity of n-channel transistor 50 and/or p-channel transistor 24. Further, elements could be chosen to cause the voltage on node z to be dependent on variations in gate length, moat width or threshold voltages, for example. After node y transitions to a high logic level, and this transition is propagated through inverters 150 and 155, p-channel transistor 24 will be turned off, eliminating static current in the voltage compensating section of the circuit.

For the operation described above to be effective, it is necessary that the node z transition from Vcc potential to the intermediate potential determined by the conductivity of the diodes D40–D40N be fast relative to the rise time of node y. This condition is easily met if the transition of node y is relatively slow, as in a delay circuit or in an output buffer drive circuit. If the rise time of the circuit node to be temperature compensated is relatively fast, then the temperature regulated voltage on gate 15 of p-channel transistor 14 must be applied before or simultaneously with the transition of Vin. A circuit for accomplishing this will be described below with the reference to FIG. 2b.

Figure 2B:
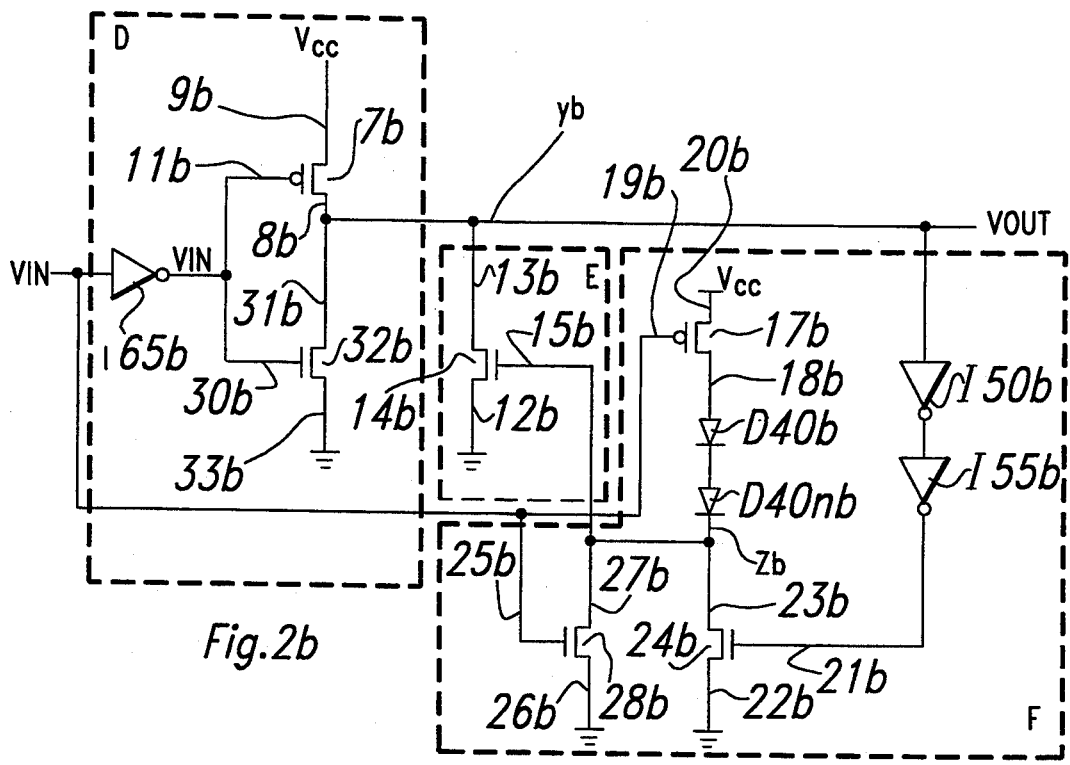
FIG. 2b is a schematic diagram of a first preferred embodiment of the invention applied to compensate the temperature dependence of the fall time of a selected circuit node.

FIG. 2b illustrates a first preferred embodiment for circuitry to provide for temperature compensation for the current and voltage fall on node yb. Node yb is defined as the intersection of the drain 11b of p-channel transistor 7b, the drain 31b of n-channel transistor 32b, the drain 13b of n-channel transistor 14b, and the input to inverter I50b. Vin is connected to the gate 8b of p-channel transistor 7b and the gate 30b of n-channel transistor 32b. The source 9b of p-channel transistor 7b is connected to Vcc. The source 33b of n-channel transistor 32b is connected to ground. The drain 31b of n-channel transistor 32b is connected the drain 8b of p-channel transistor 7b and to node yb. The drain 13b of n-channel transistor 14b is also connected to node yb. The source 12b of n-channel transistor 14b is connected to ground. The gate 15b of n-channel transistor 14b is connected to node zb. Node zb is defined as the intersection of the gate 15b of n-channel transistor 14b, the drain 23b of n-channel transistor 24b, the drain 27b of n-channel transistor 28b, and the output of diode d40nb. The source 22b of n-channel transistor 24b is connected to ground. Inverters I50b and I55b are connected in series between node yb (Vout) and the gate 21b of n-channel transistor 24b. Diodes D40b through D40nb are connected in series between the drain 18b of p- channel transistor 17b and the drain 23b of n-channel transistor 24b. The gate 19b of p-channel transistor 17b is connected to Vin'. The source 20b of n-channel transistor 17b is connected to Vcc. Vin' is connected to the input of inverter I65b. Vin' is also connected to gate 25b of n-channel transistor 28b. The drain 27b of n-channel transistor 28b is connected to node zb. The source 26b of n-channel transistor 28b is connected to ground. Block A contains the logic circuit of FIG. 2b, block B contains the compensating transistor circuit of FIG. 2b, and block C provides the bias circuitry of FIG. 2b.

TABLE II

| STATIC CONDITIONS OF TRANSISTORS IN FIG. 2b | | |
|---|---|---|
| | VIN (STATIC) | |
| TRANSISTORS | HIGH | LOW |
| 7b | OFF | ON |
| 14b | ON | OFF |
| 17b | ON | OFF |
| 24b | OFF | ON |
| 28b | OFF | ON |
| 32b | ON | OFF |

Table II shows two conditions: Vin at a static high level or at a static low level. One can see the static conditions for all transistors in the circuit 2b for both high and low static conditions of Vin. In the high condition at Vin, p-channel transistor 7b will be off because of its gate 11b being at a high. P-channel transistor 17b will be on because of its gate 19b being low. N-channel transistors 32b and n-channel transistor 14b will also be on because of their gates 30b and 15b respectively being high. N-channel transistor 24b is off because its gate 21b is low. N-channel transistor 28b is off because its gate 25b is low. In the condition when Vin is at a static low, p-channel transistor 7b will be on because of its gate 11b being low. N-channel transistor 32b will be off because of a low level at its gate 30b. N-channel transistor 24b will be on because of its gate 21b being at a high level. P-channel transistor 17b will be off because of its gate 16b being high. N-channel transistor 14b will be off because of its gate 15b being low. N-channel transistor 28b will be on because of its gate 25b being high.

The embodiment illustrated in FIG. 2b is designed to compensate for the effect of temperature variation of the conductivity of n-channel transistor 32b on the fall time of node yb when Vin transitions from a low to high. When Vin transitions from low to high, n-channel transistor 32b and p-channel transistor 17b turn on and p-channel transistor 7b is turned off. N-channel transistor 14b will partially turn on as the voltage on node z rises, and thus current will flow through n-channel transistors 32b and 14b to lower the voltage on node y. The voltage to which node zb rises will depend upon the conductivity of the diodes D40b through D40Nb which are temperature sensitive. At lower temperatures the voltage at node zb will be lower relative to that at higher temperature. The number of diodes and relative sizes of diodes and transistors can be adjusted so that the sum current flowing through n-channel transistor 32b and n-channel transistor 14b from node yb is relatively independent of temperature. It is also possible to select the number of diodes and relative sizes of transistors such that the flow of current will be greater at high temperatures, or vice versa. After node yb transitions to a low level, and this transition is propagated through inverters I50b and I55Nb, n-channel transistor 24b will be turned off eliminating static current in the voltage compensating part of the circuit.

It should be noted that the preferred embodiments are intended to allow for any temperature sensitive element in place of the diode(s), and other circuitries that provide temperature responses that affect the voltage on the gate of a transistor. Also, it is intended to allow for other parameters e.g. Vt and gate length to affect these voltages. It is further intended that the invention allows for application to various logic gates, such as nand or nor, as well as to an inverter as described.

FIG. 3 shows an embodiment of the temperature regulating circuit for the rise and fall time on node yc, in which the temperature compensated circuit H supplants the initial logic circuit (inverter) A. The input voltage VIN is connected to the gates 10c, 18c, 22c, and 26c of p-channel transistor 12c, n-channel transistor 20c, p-channel transistor 24c, and n-channel transistor 28c, respectively. Supply voltage VCC is connected to the sources 1c, 9c, 13c, and 21c of p-channel transistors 4c, 12c, 16c, and 24c respectively. Ground is connected to the sources 7c, 19c, 27c, and 31c of n-channel transistors 8c, 20c, 28c, and 32c respectively. Vout is connected to the drains 3c and 5c of p-channel transistor 4c and n-channel 8c respectively, and to the gates 14c and 30c of p-channel transistor 16c and n-channel transistor 32c respectively. One terminal of element D40c - D40Nc (the anode of diode D40c as illustrated) is connected to the drains 11c and 15c of p-channel transistors 12c and 16c respectively, and to the gate 2c of p-channel transistor 4c. This node is labeled node pc. The other terminal of element D40c - D40Nc (cathode of diode D40Nc as illustrated) is connected to the drain 17c of n-channel transistor 20c. One terminal of element D50c - D50Nc (the anode of diode D50c as illustrated) is connected to the drain of p-channel transistor 24c. The other terminal of element D50c - D50Nc (the cathode of diode D50Nc as illustrated) is connected to the drains 25c and 29c of n-channel transistors 28c and 32c respectively, and to the gate 6c of n-channel transistor 8c.

For the static condition of VIN high, n-channel transistor 8c, p-channel transistors 12c, 16c and 24c are off, p-channel transistors 4c, n-channel transistors 20c, 28c, and 32c are on, nodes pc and qc are low, and VOUT is high. When VIN transitions from high to low, n-channel transistors 20c and 28c are turned off, and p-channel transistors 12c and 24c are turned on. The voltage on node pc will go high and p-channel transistor 4c will be turned off. The voltage on node qc will also go high, but as limited by the current through diodes D50c - D50Nc sourced by n-channel transistor 32c. N-channel transistor 8c will then be partially turned on, lowering the voltage of VOUT. The characteristics of p-channel transistor 24c and n-channel 32c (e.g. gate width and gate length) and the characteristics of diodes D50c - D50Nc are chosen to give the desired voltage on node qc to adjust the parameter dependence of the current supplied by n-channel transistor 8c. As the voltage on VOUT lowers, n-channel transistor 32c is turned off, turning off static current in the control circuitry.

For the static condition of VIN low, transistors n-channel transistor 8c, p-channel 12c, p-channel transistor 16c and p-channel transistor 24c are on, p-channel transistor 4c, n-channel transistor 20c, n-channel transistor 28c, and n-channel transistor 32c are off, nodes pc and qc are high, and VOUT is low. When VIN transitions from low to high, n-channel transistors 20c and 28c are turned on, and p-channel transistors 12c and 24c are turned off. The voltage on node qc will go low and n-channel transistor 8c will be turned off. The voltage on node pc will also go low, but as limited by the current through diodes D40c - D40Nc sourced by p-channel transistor 16c. P-channel transistor 4c will then he partially turned on, raising the voltage of VOUT. The characteristics of p-channel transistors 16c and n-channel transistor 20c (e.g. gate width and gate length) and the characteristics of diodes D40c - D40Nc are chosen to give the desired voltage on node pc to adjust the parameter dependence of the current supplied by p-channel transistor 4c. As the voltage on VOUT rises, p-channel transistor 16c is turned off, turning off static current in the control circuitry.

It is believed that this invention is the first use of a controlled voltage to the gate of a switching transistor where the gate voltage is controlled to obtain the desired temperature (or other parameters) response.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit for regulating a response time of a logic circuit having at least one drive transistor comprising:
   a rise time compensating transistor connected to an output node of said logic circuit for supplying current to said output node; and
   control circuitry for supplying a first bias voltage to a gate of said rise time compensating transistor responsive to a predetermined parameter, said control circuitry comprising a first element sensitive to said predetermined parameter, a first input connected to said output node, and a second input connected to said logic circuit.

2. The circuit of claim 1 wherein said predetermined parameter comprises temperature.

3. The circuit of claim 1 wherein said predetermined parameter comprises gate length.

4. The circuit of claim 1 wherein said predetermined parameter comprises threshold voltage.

5. The circuit of claim 1, wherein said control circuitry further comprises:
   at least one transistor connected to said gate of said rise time compensating transistor, wherein said first element is connected to said gate of said rise time compensating transistor and wherein said at least one transistor and said first element are chosen such that the sensitivity of the response time of said node to said predetermined parameter is increased.

6. The circuit of claim 1, wherein said control circuitry further comprises:
   at least one transistor connected to said gate of said rise time compensating transistor, wherein said first element is connected to said gate of said rise time compensating transistor and wherein said at least one transistor and said first element are chosen such that the sensitivity of the response time of said output node to said predetermined parameter is reduced.

7. The circuit of claim 1, wherein said first element comprises a diode.

8. The circuit of claim 1, wherein said first element comprises a plurality of diodes.

9. The circuit of claim 1, wherein said first element comprises a polysilicon resistor.

10. The circuit of claim 1, further comprising:
    a fall time compensating transistor connected to said output node for regulating the fall time of said output node, wherein said control circuitry supplies a second bias voltage to a gate of said fall time compensating transistor responsive to said predetermined parameter, said control circuitry comprising a second element sensitive to said predetermined parameter.

11. The circuit of claim 10, wherein said second element comprises at least one diode.

12. The circuit of claim 10, wherein said second element comprises a polysilicon resistor.

13. A temperature compensation circuit for modifying the temperature dependence of a logic circuit having a drive transistor for supplying current to an output node of the logic circuit, comprising:
   a compensating transistor connected in parallel with said drive transistor for compensating the current of said drive transistor; and
   control circuitry connected between said output node and a gate of said compensating transistor for supplying a temperature dependent voltage level to said gate of said compensating transistor, said control circuitry comprising a temperature sensitive element, wherein said output node is connected to an input of said control circuitry.

14. The temperature compensated circuit of claim 13, wherein said control circuitry further comprises:
   at least one transistor connected to said gate of said compensating transistor, wherein said at least one transistor and said temperature sensitive element are chosen such that a response time of said output node is less sensitive to temperature.

15. The temperature compensated circuit of claim 13, wherein said control circuitry further comprises:
   at least one transistor connected to said gate of said compensating transistor, wherein said at least one transistor and said temperature sensitive element are chosen such that a response time of said output node is faster at high temperatures than a low temperatures.

16. The temperature compensated circuit of claim 13, wherein said temperature sensitive element comprises at least one diode.

17. The temperature compensated circuit of claim 13, wherein said temperature sensitive element is a polysilicon resistor.

* * * * *